(12) United States Patent
Shiozawa et al.

(10) Patent No.: US 7,345,741 B2
(45) Date of Patent: Mar. 18, 2008

(54) ILLUMINATION OPTICAL SYSTEM AND EXPOSURE APPARATUS

(75) Inventors: Takahisa Shiozawa, Tochigi-ken (JP); Yoshio Goto, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 11/144,710

(22) Filed: Jun. 2, 2005

(65) Prior Publication Data
US 2005/0270608 A1 Dec. 8, 2005

(30) Foreign Application Priority Data
Jun. 4, 2004 (JP) ............................. 2004-166552
Apr. 14, 2005 (JP) ............................. 2005-116585

(51) Int. Cl.
*G03B 27/72* (2006.01)
*G03B 27/42* (2006.01)
*G03B 27/54* (2006.01)

(52) U.S. Cl. ............................. 355/71; 355/53; 355/67
(58) Field of Classification Search .................. 355/53, 355/67, 71, 77; 359/738, 739, 740, 483, 359/501, 888
See application file for complete search history.

(56) References Cited

U.S. PATENT DOCUMENTS

| | | | |
|---|---|---|---|
| 5,300,972 A | 4/1994 | Kamon | |
| 5,559,583 A | 9/1996 | Tanabe | |
| 6,049,374 A | 4/2000 | Komatsuda et al. | |
| 6,281,967 B1 | 8/2001 | Kudo | |
| 6,339,467 B1 | 1/2002 | Sato | |
| 6,535,274 B2 | 3/2003 | Antoni | |
| 6,608,665 B1* | 8/2003 | Nishi et al. ................... | 355/53 |
| 2003/0151730 A1 | 8/2003 | Shinoda | |
| 2004/0227923 A1* | 11/2004 | Flagello et al. ............... | 355/71 |
| 2005/0024619 A1* | 2/2005 | Shinoda et al. ............... | 355/71 |

FOREIGN PATENT DOCUMENTS

| | | |
|---|---|---|
| EP | 1 367 446 A1 | 12/2003 |
| EP | 1 610 181 A2 | 12/2005 |
| JP | 2002-75843 A | 3/2002 |
| JP | 2002-93700 A | 3/2002 |
| JP | 2003-243276 A | 8/2003 |
| WO | WO 2004/025370 A1 | 3/2004 |

OTHER PUBLICATIONS

English Abstract of JP 2003-243276 A; Publication date Aug. 29, 2003; (1 page).
English Abstract of JP 2002-93700 A; Publication date Mar. 29, 2002; (1 page).
English Abstract of JP 2002-75843 A, Publication date Mar. 15, 2002; (1 page).
European Search Report (dated Oct. 31, 2007) for U.S. Appl. No. 05253359.3

* cited by examiner

*Primary Examiner*—Alan Mathews
(74) *Attorney, Agent, or Firm*—Morgan & Finnegan, LLP

(57) ABSTRACT

An illumination optical system that is used for an exposure apparatus that includes a mirror and exposes an object, illuminates a surface to be illuminated using light from a light source, and includes a filter member arranged at a position that substantially has a Fourier transform relationship with the surface to be illuminated, the filter member including a transmittance distribution preset to correct a non-uniformity of a transmittance distribution of the illumination optical system caused by the mirror.

28 Claims, 14 Drawing Sheets

154a

154b

ILLUMINATION OPTICAL SYSTEM AND EXPOSURE APPARATUS

BACKGROUND OF THE INVENTION

The present invention relates to an illumination optical system, and more particularly to control over an incident angle distribution or light distribution characteristic (also referred to as "effective light source" and "σ distribution") on a surface to be illuminated ("target surface"). The inventive illumination optical system is suitable for an exposure apparatus for the micro-lithography used to manufacture fine patterns such as semiconductor devices, liquid crystal devices ("LCDs") and magnetic materials.

A projection exposure apparatus has been conventionally employed which uses a projection optical system to project a circuit pattern of a reticle (or a mask) onto a wafer, etc. to transfer the circuit pattern, in manufacturing such fine semiconductor devices as a semiconductor memory and a logic circuit using the photolithography technology. Along with the recent demands for smaller and lower profile electronic apparatuses, the finer processing to the semiconductor devices mounted on the electronic apparatuses are increasingly required. One known means for achieving the high resolution is to increase the numerical aperture ("NA") of the projection optical system (high NA scheme).

In addition, for the high-quality exposure, an effective light source should be optimized in accordance with a pattern of the surface to be illuminated, such as a reticle. For example, the effective light source distribution is implemented by adjusting an intensity distribution near a fly-eye lens's exit surface to a desired shape, such as a normal illumination condition, an annular illumination condition and a quadrupole illumination condition. A projection exposure apparatus is required to have a means for optimizing the NA of the projection optical system, a coherence factor σ that is the illumination optical system's NA/the projection optical system's NA and the effective light source to processes having various characteristics.

The optical path in the recent illumination optical system becomes longer as the required function diversifies, e.g., a function of forming various effective light sources. It is therefore difficult to arrange the illumination optical system along a straight line, and it is necessary to deflect the optical path using a deflection mirror so as to reduce the size of the exposure apparatus. One known means for monitoring the exposure dose is to provide the illumination optical system with the half-mirror and to monitor the transmitting light through or reflected light from the half-mirror.

When the incident exposure light spreads in the deflection mirror or the half-mirror, the incident angle of the light can differ according to locations in the mirror. The conventional design technology has maintained mirror's transmittance or reflectance fluctuations within the latitude, but recently had difficulties in doing so as the high NA scheme advances in accordance with the fine-processing request. In addition, a usable coating material is limited for use with the mirror and the light having a wavelength of 250 nm or smaller, and the design freedom is limited accordingly.

Therefore, a desired effective light source distribution could be obtained when no mirror is used, but when the mirror is used, its transmittance and reflectance characteristics preclude a formation of the desired effective light source distribution. This problem causes a pattern to be exposed with a coherence factor σ different from the optimized one that provides a transfer of the minimum critical dimension ("CD") of the pattern, thereby preventing the designed resolution CD (in particular minimum CD) from being obtained. In addition, another problem of "HV difference" occurs which is a difference between horizontal and vertical CDs transferred on a wafer, lowering the yield.

Moreover, the contrast of the interference fringe of a line and space ("L & S") pattern formed on the photosensitive agent lowers when the diffracted light from the L & S pattern is the p-polarized light. This decrease becomes striking as the high NA scheme proceeds. Accordingly, studied as a solution for this problem is a polarized illumination that utilizes the s-polarized light, in which a vibration direction of an electric field vector of the light is parallel to the wafer surface and perpendicular to the light traveling direction. Nevertheless, the s-polarized light and the p-polarized light have different transmittances and reflectances on the mirror and cause a similar HV difference.

Prior art for solving the non-uniformity of the transmittance distribution in the illumination optical system includes, for example, Japanese Patent Applications, Publication Nos. 2002-093700, 2003-243276, and 2002-75843.

While Japanese Patent Application, Publication No. 2002-093700 proposes a correction of the transmittance by adjusting an angle between two filters each having a discrete transmittance distribution, the angular adjustment requires a measurement of the actual effective light source and a long time. Another problem is that the discrete transmittance distribution cannot improve the correction accuracy. On the other hand, Japanese Patent Application, Publication No. 2003-243276 has a purpose to correct the non-uniformity of the transmittance caused by an incident position upon the lens, but does not consider the non-uniformities of the reflectance and transmittance caused by an incident angle upon a mirror.

BRIEF SUMMARY OF THE INVENTION

The present invention is directed to an illumination optical system that obtains a desired effective light source relatively easily and quickly, an exposure apparatus having the illumination optical system, and a device manufacturing method using the exposure apparatus.

An illumination optical system according to one aspect of the present invention that is used for an exposure apparatus that includes a mirror and exposes an object illuminates a surface to be illuminated using light from a light source, and includes a filter member arranged at a position that substantially has a Fourier transform relationship with the surface to be illuminated, the filter member including a transmittance distribution preset to correct a non-uniformity of a transmittance distribution of the illumination optical system caused by the mirror.

An illumination optical system according to another aspect of the present invention that is used for an exposure apparatus that includes a mirror and exposes an object illuminates a surface to be illuminated using light from a light source, and includes a polarization setting section for setting a predetermined polarization of the light to each of plural areas in an effective light source as an incident angle distribution of the light on the surface to be illuminated, and plural filter members arranged at a position that substantially has a Fourier transform relationship with the surface to be illuminated, wherein each filter is arranged to a corresponding one of the plural areas in the effective light source, and has a transmittance distribution that is optimized to each polarization.

An illumination optical system according to still another aspect of the present invention that is used for an exposure apparatus that includes a mirror and exposes an object illuminates a surface to be illuminated using light from a light source, and includes a light shaping member for forming a base shape of an effective light source as an incident angle distribution of the light on the surface to be illuminated, and a stop that is arranged movably along an optical axis of the light.

An illumination optical system according to another aspect of the present invention that is used for an exposure apparatus that includes a mirror and exposes an object illuminates a surface to be illuminated using light from a light source, and includes a polarization setting section for setting a predetermined polarization state of the light to each of plural areas in an effective light source as an incident angle distribution of the light on the surface to be illuminated, and a stop that is arranged movably along an optical axis of the light.

An exposure apparatus according to another aspect of the present invention includes the above illumination optical system for illuminating a reticle as a surface to be illuminated using light from a light source, and a projection optical system for projecting a pattern of a reticle onto an object.

A device manufacturing method includes the steps of exposing an object using the above exposure apparatus, and developing the exposed object.

A device manufacturing method includes the steps of exposing an object using the above exposure apparatus, and developing the exposed object. Claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
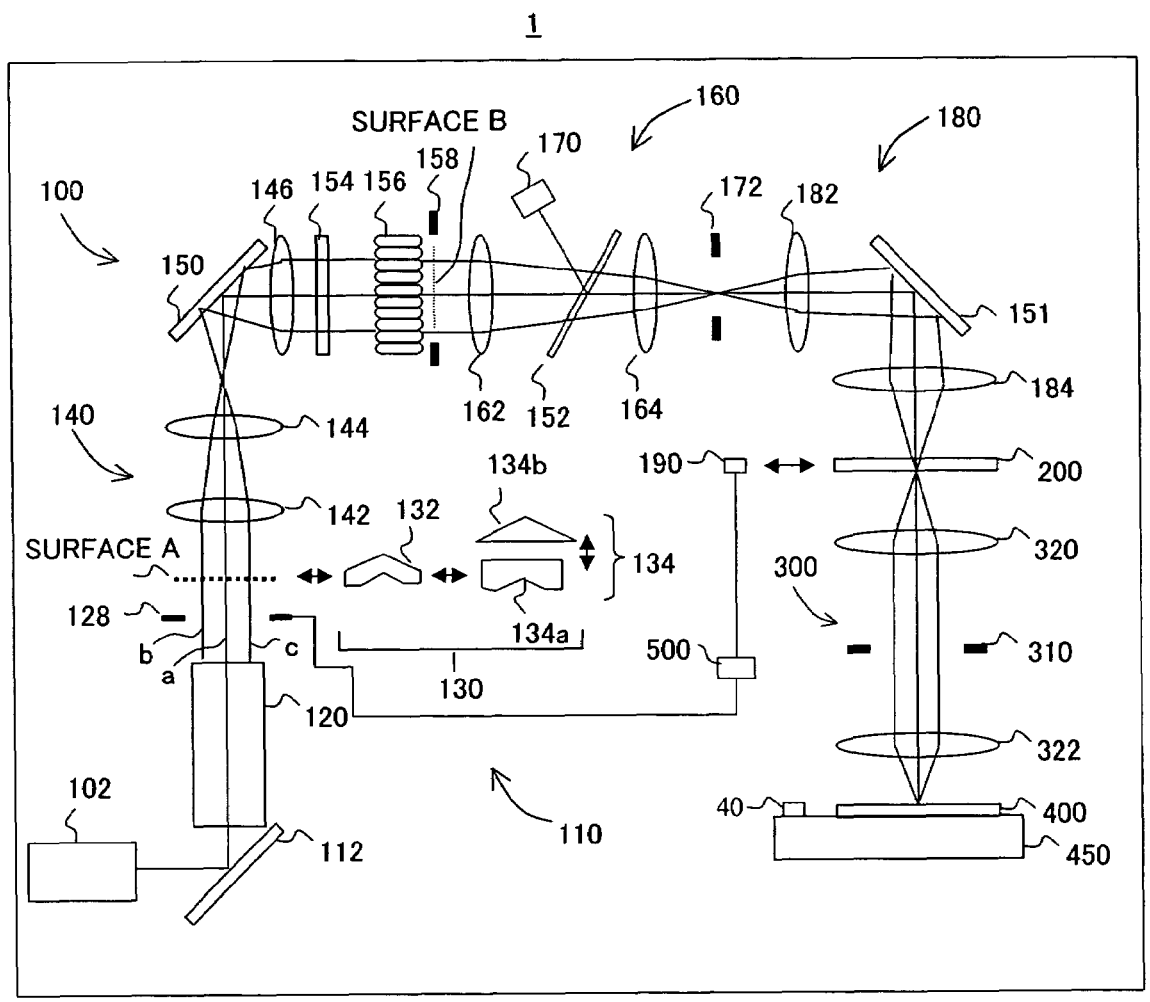
FIG. 1 is a schematic structure of an exposure apparatus according to one aspect of the present invention.

A description will now be given of an exposure apparatus 1 according to one aspect of the present invention, with reference to the accompanying drawings. Here, FIG. 1 is a schematic structure of the exposure apparatus 1. The exposure apparatus 1 includes, as shown in FIG. 1, an illumination apparatus 100, a reticle 200, a projection optical system 300, a plate 400, a plate stage 450, and a controller 500. The exposure apparatus 100 is a projection exposure apparatus that exposes a circuit pattern of the reticle 200 onto the plate 400 in a step-and-scan manner. However, the present invention is applicable to a step-and-scan exposure apparatus.

The illumination apparatus illuminates the reticle 200 that has a circuit pattern to be transferred, and includes a light source section 102 and an illumination optical system 110.

The light source section 102 may use as a light source, for example, an ArF excimer laser with a wavelength of about 193 nm, a KrF excimer laser of a wavelength of about 248 nm, etc. However, the type of the light source is not limited to the excimer laser and may use an $F_2$ laser having a wavelength of about 157 nm. The number of light sources is not also limited. The light source section 102 when using a laser uses preferably an incoherently turning optical system that turns a coherent laser beam into an incoherent one. A light source applicable to the light source section 102 is not limited to the laser, but may use one or more lamps such as a mercury lamp, xenon lamp, etc. The exposure apparatus 1 of this embodiment is effective to the light having a wavelength of 250 nm, as described later.

The illumination optical system 110 illuminates the reticle 200, and includes a lens, a mirror, an optical integrator, a stop, etc. The illumination optical system 110 of this embodiment includes a light shaping means 120, a light adjusting means 130, an imaging optical system 140, plural deflection mirrors 112, 150 and 151, a filter member 154, a fly-eye lens 156, a variable stop 158, a condenser optical system 160, a half-mirror 152, a detector 170, a masking blade 172, and an imaging optical system 180.

The deflection mirror 112 deflects the light from the light source section 102 toward the light shaping means 120.

The light shaping means 120 shapes the light from the light source section 102 into the light having a necessarily shaped distribution, such as a circle, an annular shape and a multi-pole shape, on a predetermined surface (surface A). In other words, the surface A is a surface that forms a base shape of the effective light source and a desired effective light source shape is made on the surface to be illuminated from the distribution having the base shape on the surface A, through shaping by the light adjusting means 130, which will be described later, through sizing by the imaging optical system 140 having a variable magnification, and through the limitation by stop members (such as the stop 158) arranged in place.

Figure 2:
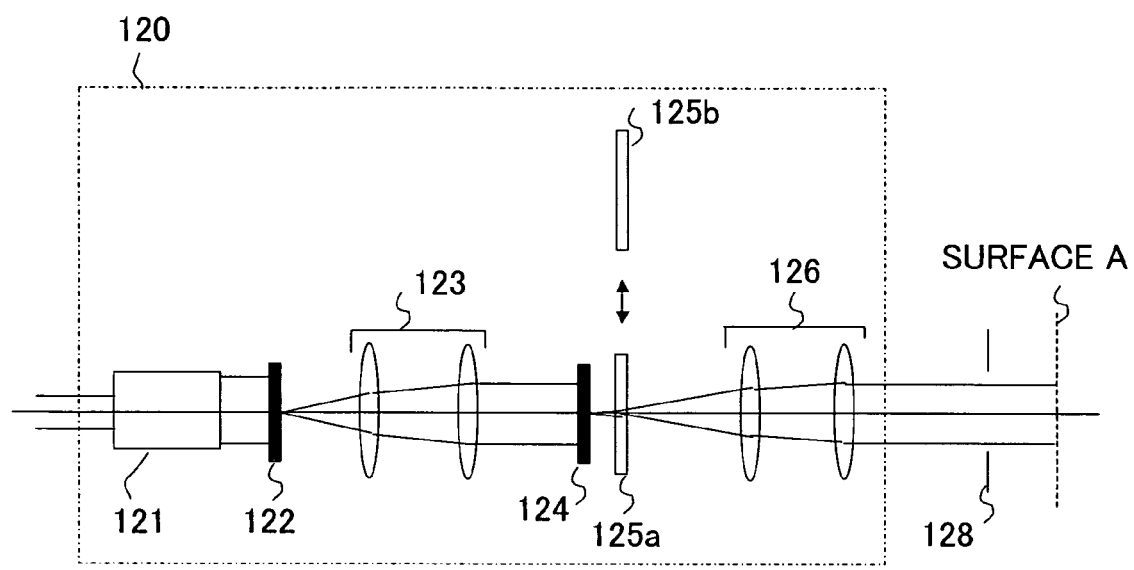
FIG. 2 is a schematic structure of a light shaping means in the exposure apparatus shown in FIG. 1.

The light shaping means 120 includes an optical integrator as one of or a combination of a fly-eye lens, an optical pipe that reflects the light on its internal surface, and a diffractive optical element ("DOE"), and a relay optical system, a condenser optical system, and a mirror, etc. The light shaping means 120 of this embodiment includes optical systems 121, 123, 126, optical integrators 122 and 124, and DOEs 125a and 125b. Here, FIG. 2 is a schematic structure of the light shaping means 120.

The optical system 121 is made of a cylindrical lens etc., and turns the incident light into a desired size, such as an approximate circle or square. The optical integrator 122 in this embodiment is a fly-eye lens that has a two-dimensionally arranged micro-lenses (rod lenses) or its equivalent, and uniformly illuminates an incident surface of the optical integrator 124 via the optical system 123. The light distribution shape on the incident surface of the optical integrator 124 is determined by the NAs of the micro-lenses in the optical integrator 122 and the focal length of the optical system 123, and is constant irrespective of the distribution of the light incident upon the optical integrator 122.

The optical integrator 124 of this embodiment is a fly-eye lens that has a two-dimensionally arranged micro-lenses (rod lenses) or its equivalent, and uniformly illuminates the incident surface of the DOE 125a or 125b. The light emitted from each area of the optical integrator 124 has approximately the same NA (or light divergent angle) throughout the areas.

The DOEs 125a and 125b are provided near the exit surface of the optical integrator 124 and can be switched by a driver (not shown). The number of DOEs is not limited two, and the driver is an apparatus, such as a turret, for inserting one of the DOEs into the optical path. The DOE is an element that diverges the incident light into a desired angular distribution, and the angular distribution of the exit light is projected onto the back focal surface (or so-called Fourier transform surface) of the optical system 126. The surface A corresponds to this Fourier transform surface. The Fourier transform relationship is a relationship between an object surface and a pupil surface or a relationship between a pupil surface and an image surface.

In each of the optical integrators 122 and 124, an incident-side (or front) focal point position approximately accords with the incident surface, and the angular characteristic of the light emitted from each integrator does not change even when the angle of the incident light changes. This configuration enables the light having a continuously steady, angular characteristic to enter the DOE, and the surface A has a continuously steady light distribution even when the light from the light source fluctuates. Each of the optical integrator 122 and 124 may be an optical pipe that reflects the light on its internal surface, a DOE, a fly-eye mirror that serves as a multiple light sources forming means and includes plural reflective optical elements, plural optical integrator that combine them with each other, or another homogenizer.

The optical integrator 124 and the DOE spaced from each other so that the light from the adjacent micro-lenses in the optical integrator 124 partially overlap each other. As the light that passes the optical integrator 122 and the optical system 123 illuminates the optical integrator 124, the DOE is uniformly irradiated without a concentration of the light. For example, when the ArF laser is used as a light source and the DOE is made of quarts, the DOE gets damaged when the large irradiation energy density concentrates on the part of the DOE. This arrangement serves as a preventive measure.

One reason why the optical integrator 124 is irradiated by the light that passes the optical integrator 122 and the optical system 123 is the steady incident light distribution on the surface A. Even without the optical integrator 122 or the optical system 123, a steady intensity distribution is available on the surface A. However, as the light distribution incident upon the integrator 124 varies, the incident light distribution (or incident angular distribution) varies on the surface A. This means that the angular distribution of the incident light varies on the reticle 200 surface to some extent. In other words, even when there is a fluctuation and error of the incident light from the light source, this configuration provides the always steadily controlled light distribution and incident angular distribution on the surface A until the DOE is switched. The light shaping means 120 of this embodiment has a double-integrator configuration but may use a triple-integrator configuration.

The pattern on the surface A is a convolution between a DOE Fourier pattern (which is a pattern formed on a Fourier transform surface when the light is perpendicularly incident at NA of 0) and the angular distribution of the light incident upon the DOE. In order to make the distribution on the surface A close to the desired distribution, it is preferable to make the NA of the exit light from the optical integrator 124 as small as possible. Therefore, it is desirable to preserve the NA x diameter of the light emitted from the optical system 121 if possible and to transmit it to the DOE. By switching the DOE, a circular, annular or multi-pole distribution, for example, is formed on the surface A. A proper design of the DOE can differently set the intensity of each pole area in the multiple poles, such as a quadrupole.

Turning back to FIG. 1, the light adjusting means 130 for further trimming a shape of the light that has been turned to the base shape by the light shaping means 120 is provided switchably near the surface A. The light adjusting means 130 includes a conical optical element 132, a conical optical element 134 that can change an interval, a plane-parallel plate (not shown), a properly shaped stop member such as an annular aperture stop, a quadrupole aperture stop and a circular stop, a pyramid optical element and a tectiform optical element, and an enlarging/reducing beam expander for changing a magnification. The light adjusting means 130 can retreat from the optical path, or can insert plural of the above components into the optical axis.

The conical optical element 132 has a conically concave, incident surface and a conically convex, exit surface and forms, for example, an annular light when it is arranged on the optical axis and the circular base shape is formed on the surface A.

The conical optical element 134 includes an optical element 134a having a conically concave, incident surface and a plane exit surface, and an optical element 134b having a plane incident surface and a conically convex exit surface. When the base shape on the surface A is a circle and the conical optical element 134 is arranged on the optical axis, the annular light is formed. By changing an interval between the optical elements 134a and 134b, a shape (or a ratio of annulus) and the size of the annular light become variable. The thus configured conical optical element 134 can effectively form the annular light in a small space. Given a quadrupole or dipole base shape on the surface A, its internal diameter and outer diameter are made variable.

Figure 3A:
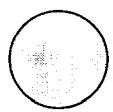
FIGS. 3A to 3C are schematic plane views for explaining an operation of a light adjusting means in the exposure apparatus shown in FIG. 1.
Figure 3B:
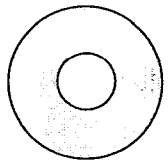
Figure 3C:
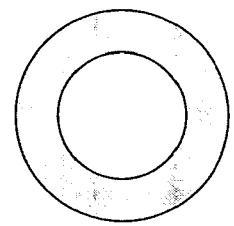
Figure 4A:
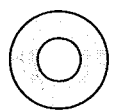
FIGS. 4A to 4C are schematic plane views for explaining another operation of the light adjusting means shown in FIG. 1.
Figure 4B:
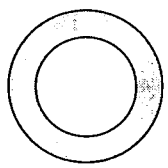
Figure 4C:
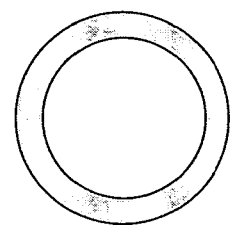
Figure 5A:
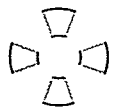
FIGS. 5A to 5C are schematic plane views for explaining still another operation of the light adjusting means shown in FIG. 1.
Figure 5B:
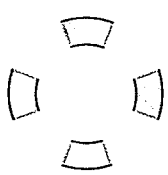
Figure 5C:
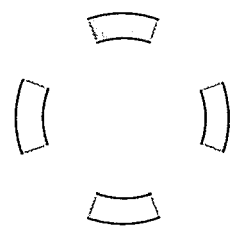

For example, given a proper selection of the DOE in FIG. 2 and an annular distribution (FIG. 3A) on the surface A, the shape of the annulus or a ratio of the annulus is variable by changing an interval between the optical elements 134a and 134b, as shown in FIGS. 3B and 3C. Given another DOE in FIG. 2 and an annular distribution (FIG. 4A) on the surface A, the shape of the annulus or a ratio of the annulus is variable by changing an interval between the optical elements 134a and 134b, as shown in FIGS. 4B and 4C. Given still another DOE in FIG. 2 and a quadrupole distribution (FIG. 5A) on the surface A, the shape of the quadrupole or a ratio of the quadrupole is variable by changing an interval between the optical elements 134a and 134b, as shown in FIGS. 5B and 5C.

As described later, since the imaging optical system 140 is a zooming optical system, by changing the magnification and the aperture diameter of the stop 158, an effective light source having a desired size can be formed having a larger ratio of annulus, such as a 2/3 annulus and a 3/4 annulus, than that formed by the light adjusting means 130.

When the conical optical element 134 is used, the restriction requirement of the incident angle of the light upon the fly-eye lens 156 should be met. When the incident angle of the light exceeds a certain angle, the light becomes unnecessary light, deforms an effective light source and/or causes the uneven light intensity. It is therefore effective to maintain an interval between the optical elements 134a and 134b and a magnification of the imaging optical system 140 within a restriction requirement of the incident angle of the fly-eye lens 156, and to vary the aperture diameter of the stop 158 so as to reduce the outer diameter and adjust the ratio of the annulus. This is not limited to the annular illumination, but may apply the quadrupole and dipole illuminations.

The conical surfaces of the optical elements 134a and 134b have approximately the same angle. The same angle restrains an angular increase of the exit light from the light shaping means 122, and minimizes the light shielding by the subsequent optical system. When the subsequent optical system has an angular leeway, the same angle is not necessarily required and the angle may be varied for the reduced annular breadth.

Instead of the conical optical element 134, other components may be used, such as a triangular roof type dipole converting element and a quadrupole converting element that can change an interval between an incident-side optical element that has a concave pyramid incident surface and an exit-side optical element that has a convex exit pyramid surface. The shape formed by the light shaping means 120 may be maintained without using the light adjusting means 130. Thus, a combination of the optical elements of the light shaping means 120 and the light adjusting means 130 would be able to form a real image or a virtual image of the light having various shape distributions near the surface A.

The zooming imaging optical system 140 changes a magnification of a shape formed on the surface A or the light turned into a desired shape by the light adjusting means 130, and the resultant light is projected onto an incident surface of the fly-eye lens 156 via the filter member 154, which will be described later. The imaging optical system 140 includes lenses 142, 144 and 146 in this embodiment, but the number of lenses is not limited.

When the light intensity distribution on the predetermined surface A forms an image on the incident surface of the fly-eye lens 156 without aberration, the outline of the light intensity distribution is highlighted and causes the uneven light intensity and the non-uniformity of the effective light source on the plate 400 that is a surface to be exposed. Therefore, an imaging relationship between the surface A and the incident surface of the fly-eye lens 156 preferably contains aberrations (including the defocus) to some extent. This is not true as the number of micro-lenses increases in the fly-eye lens 156 and the influence on the uneven light intensity is small.

In response to the incident light, the fly-eye lens 156 forms plural light source images (or secondary light sources) near its exit surface, and uniformly illuminates the reticle 200 surface. A diameter variable (or switchable) stop 158 is arranged near the surface where plural light source images are formed, i.e., surface B. The surface where plural light source images are formed (or the back focal surfaces of the micro-lenses in the fly-eye lens 156) has a relatively high energy density of the light, and the stop 158 defocuses from this surface slightly (e.g., from minus several millimeters to plus several millimeters apart from this surface). Of course, if the stop 158 can endure the energy density, the stop 158 may be arranged on the surface where plural light source images are formed.

The stop 158 and the aperture stop 310 are arranged in an approximately optically conjugate relationship. At the exit surface side of the stop 158, an image of the multiple light sources formed by the fly-eye lens 156 and the stop 158 on the aperture stop 310 is the illumination light shape (effective light source shape) at each point on the plate 400 surface.

Among beams from plural light source images, the beams unrestricted by the stop 158 effectively illuminate the surface on which the masking blade 172 is arranged, via the condenser optical system 160. Due to the imaging optical system 180, the masking blade 172 is optically conjugate with a surface where the reticle 200 is arranged, and determines an illuminated area on the reticle 200 surface. The condenser optical system 160 of this embodiment includes lenses 162 and 164, and the imaging optical system 180 of this embodiment includes lenses 182 and 184. However, the number of lenses of the optical systems 160 and 180 is not limited.

The half-mirror 152 is provided between the lenses 162 and 164 in the condenser optical system 160. The half-mirror 152 splits the incident light into the reflected light and the transmitting light, one of which is used to illuminate the reticle 200, and the other of which is used to indirectly monitor the exposure dose incident upon the reticle 200 using a detector 170. An arrangement between the half-mirror 152 and the detector 170 is not limited to that shown in FIG. 1, and they may be arranged on the optical path from the light source section 102 to the masking blade 172. The detector 190 that measures the effective light source distribution is provided near the reticle 200, and can be inserted into and ejected from the optical path between the reticle 200 and the projection optical system 300.

This embodiment arranges, as shown in FIG. 1, the deflection mirrors 150 and 151 and the half-mirror 152 so that the optical path is arranged on one plane from the DOE shown in FIG. 2 to the plate 400 surface. As a result, as described later, the filter member 154 has a simple structure.

A description will be given of the filter member 154 and the σ shape correction mechanism 128.

Referring now to FIG. 1, a description will be given of the non-uniformity of the transmittance distribution of the illumination optical system 110 caused by the mirrors 150 to 152. With respect to a principal ray a and rays b and c having predetermined NAs on a section parallel to the paper surface of FIG. 1, when there is no deflection mirrors 150 and 151 and half-mirror 152, these rays are symmetrical with respect to the optical axis, and have no difference in transmittance on the optical path from the surface A to the reticle 200 surface. Even if these mirrors exist, no transmittance difference occurs with respect to rays b and c if these rays b and c are parallel on each mirror.

However, due to the design restriction (or the space and aberration optimizations), it is difficult to strictly equalize the incident angles upon the mirrors 150 and 151 and the half-mirror 152 in an actual configuration. Although no problems occur when these optical elements are coated with a material whose transmittance or reflectance does not depend upon the incident angle, the coating material is limited for the light having a wavelength of 250 nm or smaller, e.g., the ArF excimer laser with a wavelength of 193 nm, and the angular dependency of the coating material becomes conspicuous. Therefore, the rays a to c have different transmittances from the surface A to the reticle 200 surface.

Figure 6:
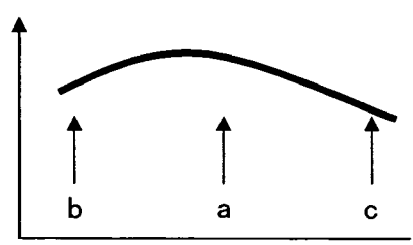
FIG. 6 is a graph for explaining a non-uniformity of a transmittance distribution caused by mirrors in the exposure apparatus shown in FIG. 1.
Figure 7:
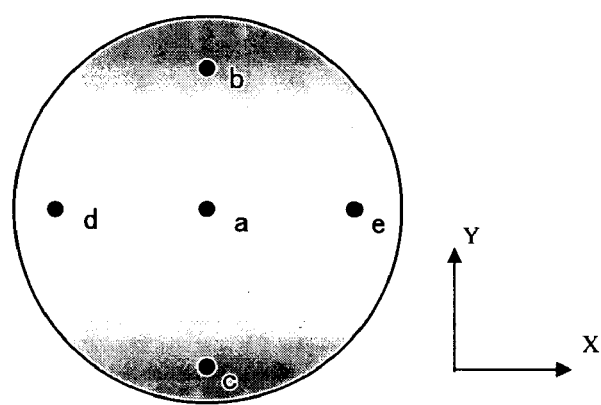
FIG. 7 is a schematic plane view for explaining a non-uniformity of a transmittance distribution caused by the mirrors in the exposure apparatus shown in FIG. 1 .

FIG. 6 shows a graph showing one exemplary transmittance distribution. FIG. 7 shows exemplary two-dimensional transmittance distribution in the σ distribution. The concentration in FIG. 7 indicates the non-uniformity of the transmittance distribution. Since incident angles of rays d and e upon each mirror located perpendicular to the paper surface on the surface A are almost the same as the incident angle of the ray a, the transmission distribution in the σ distribution is approximately constant in the X direction as shown in FIG. 7, but changes in the Y direction. Therefore, even when the distribution that is symmetrical with respect to the XY directions on the surface A, the σ distribution on the reticle 200 surface has a weaker intensity in the Y direction than that in the X direction. The exposure using this σ distribution result in different imaging performance to a pattern in the X direction and a pattern in the Y direction, causing the CD difference in two orthogonal directions. In addition, when the projection optical system 300 subsequent to the reticle 200 uses a mirror or is a catadioptric optical system, the mirror makes the σ distribution on the plate 400 surface non-uniform, causing the imaging performance to a pattern in the X direction and a pattern in the Y direction, resulting in the CD difference in two orthogonal directions, even if the σ distribution on the reticle 200 surface is uniform.

In other words, due to the non-uniform transmittance distribution to the pupil 310, the effective light source distribution becomes non-uniform. A first solution for this problem according to this embodiment arranges the first filter member 154 for making the transmission distribution uniform. In other words, the filter member 154 has a transmission distribution that cancels the non-uniformity of the transmission distribution caused by the mirrors in the illumination and projection optical systems.

This embodiment arranges the filter member 154 just before the fly-eye lens 156, but a position of the filter member 154 is not limited to this position, as long as it has substantially a Fourier transform with the reticle 200 surface that is the surface to be illuminated (or the position conjugate with the pupil 310 surface). This embodiment attempts to make uniform the transmittance distribution up to the pupil 310, and the pupil 310 has a Fourier transform relationship with the reticle 200 and the exit surface of the fly-eye lens 156 is conjugate with the pupil 310. The filter member 154 can be arranged near the incident or exit surface of the fly-eye lens 156 or a surface that optically conjugate with the incident or exit surface of the fly-eye lens 156. The reason why the filter member 154 can be arranged at the incident surface of the fly-eye lens 156 is that the fly-eye lens 156 approximately maintains the effective light source between the incident and exit surfaces (or before and after the fragmentation) for each lens element. In this respect, the filter member 154 may be provided on the surface (or surface A) which determines the base shape of the effective light source or on or near a position optically conjugate with the surface, and the "position that has substantially a Fourier transform relationship with the surface to be illuminated" intends to cover the surface (or surface A) which determines the base shape of the effective light source or on or near a position optically conjugate with the surface.

Figure 8A:
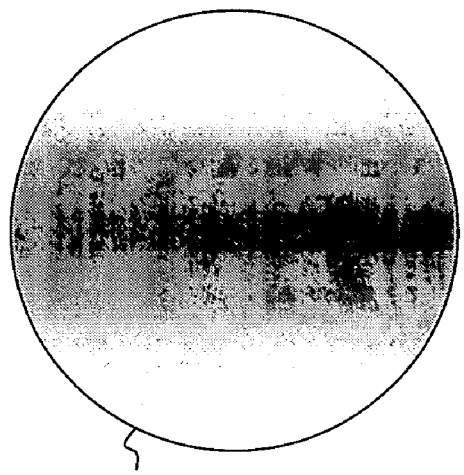
FIGS. 8A to 8C are schematic plane views of filter members in the exposure apparatus shown in FIG. 1.
Figure 8B:
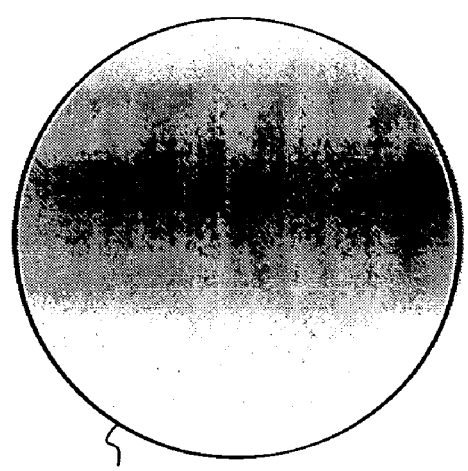

FIGS. 8A and 8B show filter members 154a and 154b having different transmittance distributions. The filter member 154a has a transmittance distribution that is symmetrical with respect to the X-axis, and the filter member 154b has a transmittance distribution that slightly offsets the transmittance distribution of the filter member 154a in the Y direction. The concentrations in FIGS. 8A and 8B are transmittance distributions that cancel out the reflectance and transmittance differences of the rays a to c on each mirror.

The filter member 154 can make the transmittance distribution on the pupil 310 approximately uniform or rotationally symmetrical. A design value of the illumination optical system 110 (that considers mirrors' reflectance and transmittance characteristics) may uniquely determine this distribution. Alternatively, the detector 190 measures the σ distribution on the reticle 200 surface, and the controller 500 may selectively arrange one of the filter members 154. A large filter member 154 may be arranged and shifted to the most suitable, calculated position in the Y direction for each apparatus and for each illumination condition.

Figure 9:
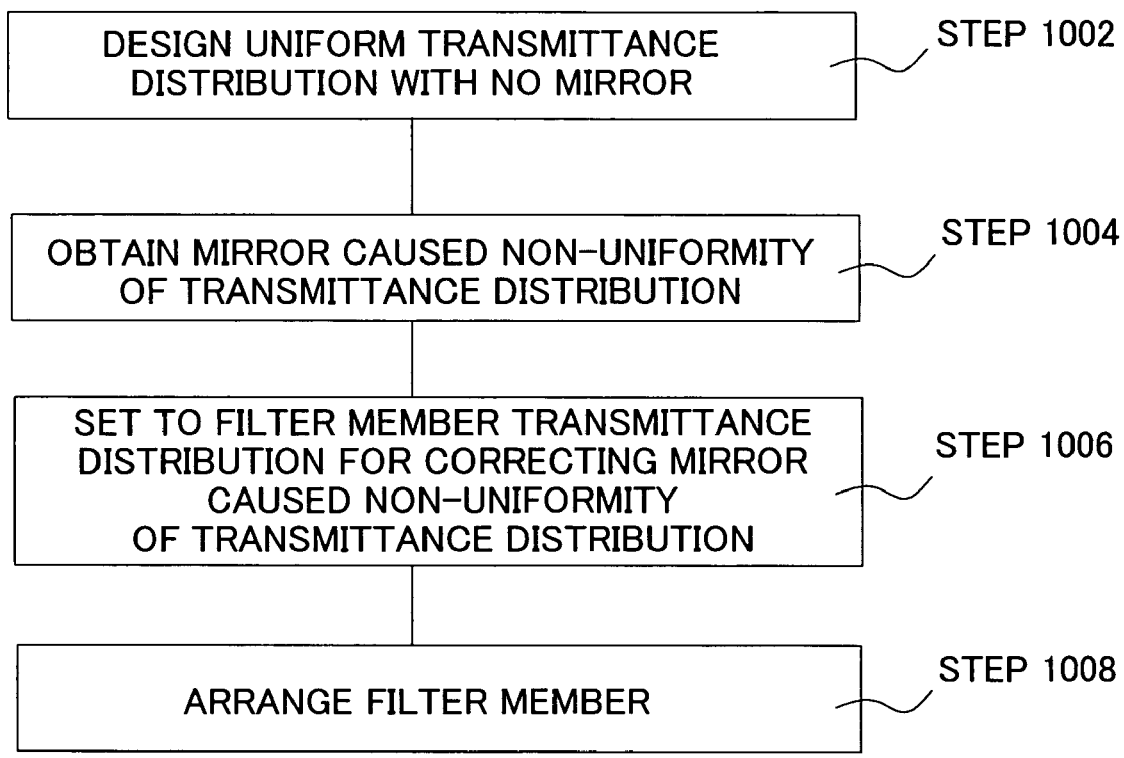
FIG. 9 is a flowchart of one illustrative illumination method for the exposure apparatus shown in FIG. 1.

Referring now to FIG. 9, a description will be given of a method for determining the transmittance distribution of the filter member 154. Here, FIG. 9 is a flowchart for setting the transmittance distribution of the filter member 154.

First, the illumination optical system 110 is designed to provide the uniform transmittance distribution on the pupil 310 without the mirrors 150 to 152 (step 1002). It is preferable to arrange on a plane the optical axis of the optical path from the light source section 102 to the reticle 200 surface that is the surface to be illuminated, because the structure of the filter member 154 thereby becomes simple like a filter that varies a concentration in one direction.

Next, the non-uniformity of the transmittance distribution caused by the projection optical system's mirror and the mirrors 150 to 152 in the illumination optical system is obtained through a simulation (step 1004). The non-uniformity of the transmittance distribution can be obtained by comparing the transmittance distributions before and after the mirrors are inserted. If necessary, the non-uniformity of the transmittance caused by other factors is obtained.

Next, the transmittance distribution is set to the filter member 154 which corrects the non-uniformity of the transmittance distribution, which is caused by the mirrors in the projection and illumination optical systems, such as mirrors 150 to 152, and measured by step 1004 (step 1006).

For example, when positions corresponding to rays a to e have transmittances of 95%, 90%, 90%, 95% and 95% in the transmittance distribution in FIG. 7, the transmittance distribution that cancels out the non-uniformity of the above transmittance distribution, such as the 90%, 95%, 95%, 90% and 90% at the above positions is set to the filter member 154. Such a transmittance distribution applies to the filter member 154*a*.

On the other hands, for example, when positions corresponding to rays a to e have transmittances of 95%, 90%, 93%, 95% and 95% in the transmittance distribution in FIG. 7, the transmittance distribution that has the above transmittance distribution, such as the 90%, 95%, about 92%, 90% and 90% at the above positions a to e, as discussed above, is produced, offset by a predetermined amount in the Y direction so as to provide the positions a to e with the uniformity of the transmittance distribution, and set to the filter member 154. Such a transmittance distribution applies to the filter member 154*b*. While this example illustrates corrections at three points in the Y direction, it is preferable to measure or interpolate more fragmented points and set a filter member having a suitable distribution that cancels the non-uniformity at these points.

The filter members 154*a* and 154*b* have substantially the same distribution in the X direction, and different in a continuously changing distribution in the Y direction. This is because the mirrors 150 to 152 are arranged so that the optical path is located on one plane, as shown in FIG. 1, from the surface A that determines the base shape of the effective light source and the reticle surface. As discussed above, since the incident angles of the rays d and e upon each mirror in a direction perpendicular to the paper surface are approximately the same as those of the ray a, such a filter distribution can correct the non-uniformity. Since the concentration of the filter changes only in one direction, the manufacture of the filter is easy. For example, this filter is easily and inexpensively manufactured through an evaporation using, for example, metal coating, by controlling positions of two shielding plates between a substrate and an evaporation source so as to form a unidirectional distribution on the substrate.

If the optical path from the surface A to the reticle 200 surface cannot be located within one plane for configuration convenience of the illumination optical system 110, two filter members 154 that have each a unidirectional distribution may be arranged so that the distribution directions are orthogonal to each other. Of course, two filter members 154 may be arranged with their distribution directions orthogonal to each other, even when the optical path from the surface A to the reticle 200 surface is arranged on one plane. Each of these two filter members or their transmission distributions may be independently shifted in the distribution direction and positioned. If necessary, two or more filter members 154 may be provided. The two or more filter members 154 may have the same transmittance distribution or different transmittance distributions.

Next, the filter member 154 having the transmittance distribution set by step 1006 is arranged on the optical path of the illumination optical system 110 (step 1008). As discussed above, the arranged position is a position that has substantially a Fourier transform relationship with the surface to be illuminated. As a result, the transmittance distribution of the filter member 154 corrects the non-uniformity of the transmittance distribution caused by the mirrors in the illumination and projection optical systems 110 and 300.

Whenever the illumination condition is changed, the controller 500 may switch the filter member 154. While a change of the illumination condition typically associates with a change of the σ distribution on the reticle 200 surface, the change of the illumination condition of this embodiment covers a change of the polarization while the σ distribution is maintained. When the NA of the projection optical system increases as in the recent exposure apparatus, the imaging performance varies due to the polarization of the light incident upon a wafer surface. So as to expose a finer pattern at a high NA or improve the image quality, the polarization controlled illumination is effective. For example, the illumination light having a polarization direction in the X direction is suitable for an L & S pattern that extends in the X direction. The exposure is thus optimized when the polarization is switched in accordance with a pattern.

Figure 15:
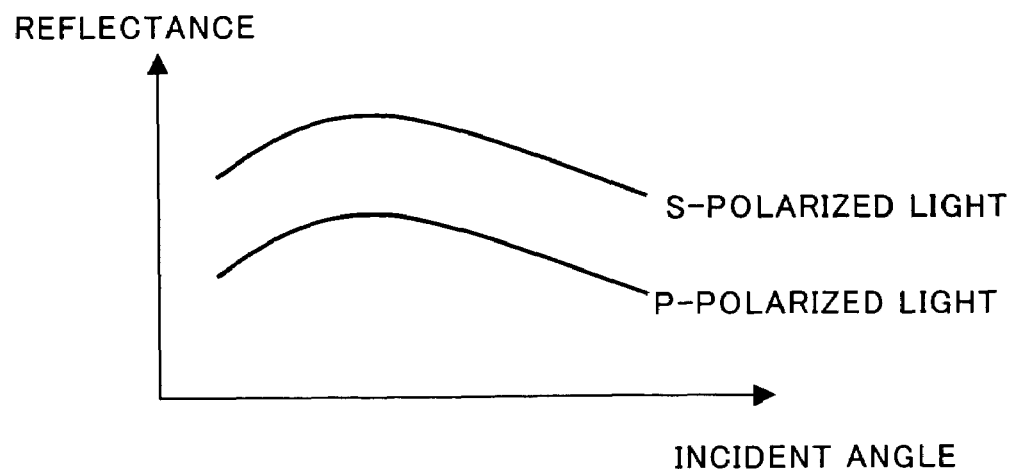
FIG. 15 is a graph for explaining a non-uniformity of a transmittance distribution of a polarization caused by the mirror in the exposure apparatus shown in FIG. 1.

In general, the above mirrors have a polarization characteristic difference in addition to the angular characteristic difference, as shown in FIG. 15. Therefore, the transmission distribution to the projection lens's pupil 310 differs even when a distribution shape is the same on the surface A if the polarization changes (in particular in the above polarization controlled illumination). According to an alternative embodiment, plural filter members 154 are provided on the switching means, such as a turret, the detector 190 measures the σ distribution on the reticle 200 surface, the controller 500 selects a proper filter member 154 from among the plural filter members 154 whenever the illumination condition changes, and arranges the selected one on the optical path.

Figure 17:
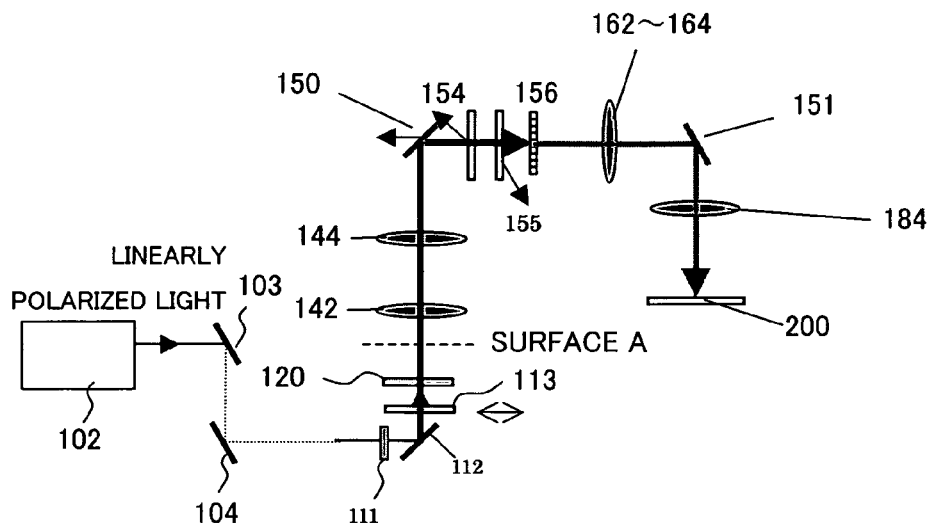
FIG. 17 is an enlarged structure of an illumination optical system shown in FIG. 1 for a polarized illumination and for a non-polarized illumination.

In this case, the illumination optical system 110 may use a structure shown in FIG. 17. Here, FIG. 17 is an enlarged structure of the illumination optical system 110 shown in FIG. 1 for the polarized illumination and for the non-polarized illumination. When the light source section 102 is a laser, the linearly polarized laser beam may be utilized. In addition, it is necessary to provide the illumination optical system 110 with the X-polarized light of a constant intensity irrespective of a difference of a polarization direction of the exit laser beam caused by the laser's installation condition and the structure of the laser deflection optical system. Thus, when the polarization direction of the exit laser beam and the reflections by the deflection mirrors 103, 104 and 112 provide the Y-polarized light, the polarized light is preferably converted into the X-polarized light by utilizing a λ/2 phase plate 111.

A phase canceling (or adjusting) plate 113 is to convert the linearly polarized light into randomly polarized light, inserted into the optical path during the non-polarized illumination and retreated from the optical path during the polarized illumination. The mirrors 150 and 151 are broadband high-reflection ("BBHR") mirrors, and the BBHR coating is designed to restrain a phase difference that occurs on the coating between the s-polarized light and the p-polarized light at broadband incident angles.

Figure 18A:
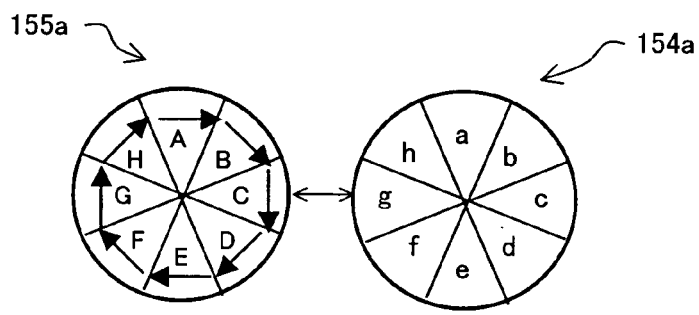
FIGS. 18A to 18C are views for explaining a method for setting a transmittance distribution to the filter in a tangentially polarized illumination.
Figure 19A:
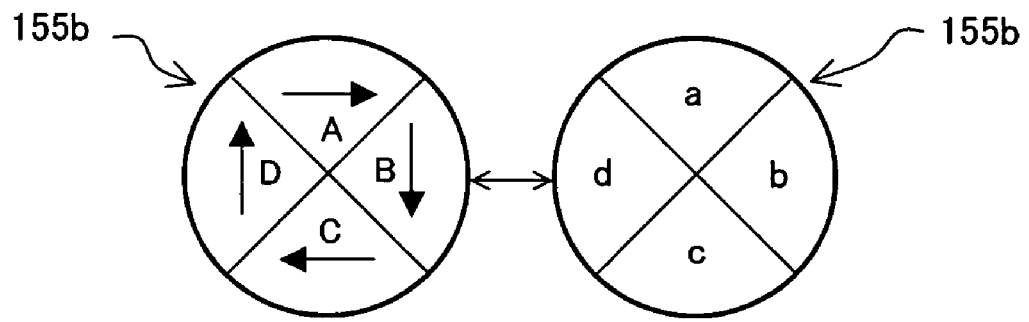
FIGS. 19A and 19B are views for explaining a method for setting a transmittance distribution to the filter in a cross-pole polarized illumination.

154 denotes a ND filter, and 155 is a λ/2 phase plate. This embodiment provides plural types of ND filters 154 and plural types of λ/2 phase plates 155, and the ND filter 154 and the λ/2 phase plate 155 make a pair. FIGS. 18A and 19A each show a pair of a different type of ND filter 154 and λ/2 phase plate 155. FIG. 18A shows a schematic plane view of a pair of a ND filter 154*a* and a λ/2 phase plate 155*a* used for the tangentially polarized illumination. FIG. 19A shows a schematic plane view of a pair of a ND filter 154*b* and a λ/2 phase plate 155*b* used for the cross-pole polarized illumination. The reference numeral 154 generalizes 154*a* and 154*b*, and the reference numeral 155 generalizes 155*a* and 155*b*.

The λ/2 phase plate 155 in the polarized illumination of this embodiment sets a predetermined polarization to each of plural areas in the effective light source. The ND filter 154 is a filter member corresponding to each area, and each filter member is preset to correct the polarization difference among rays and the resultant non-uniformity of the transmittance distribution caused by the mirrors.

Figures 18B, 18C:
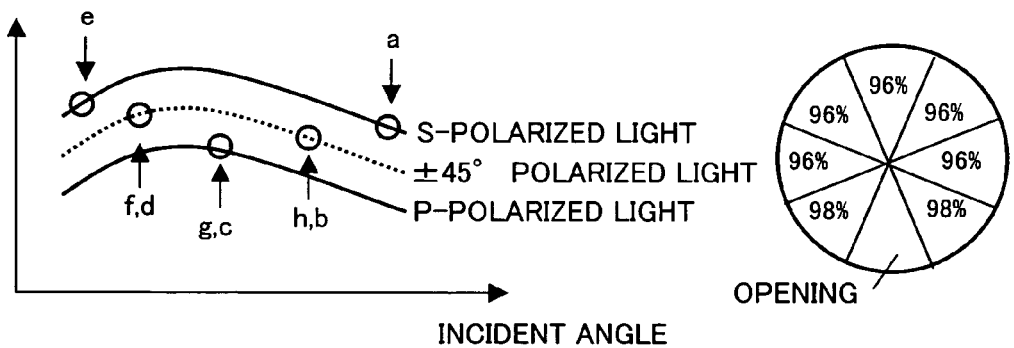
Figure 19B:
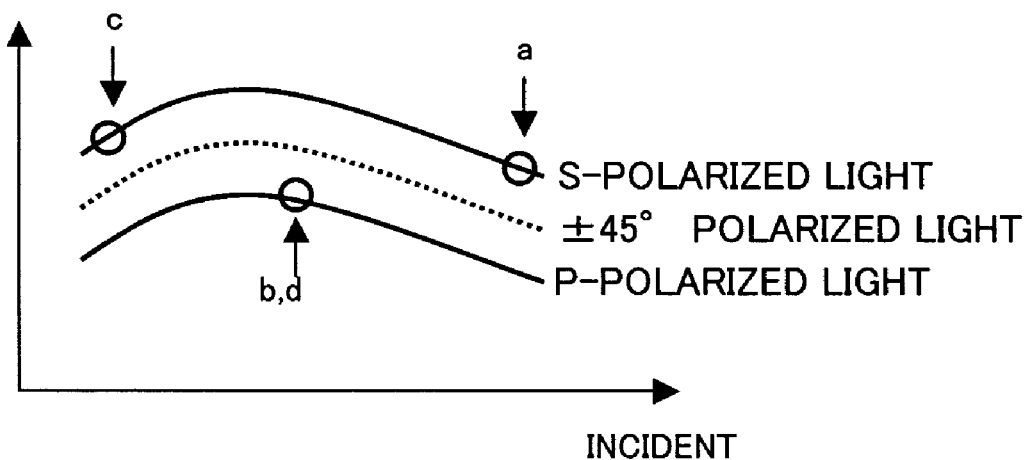

FIGS. 18B and 19B correspond to FIG. 6, and show the transmittance distribution that depends upon the incident angles upon the ND filters 154a and 154b. The ordinate of the graph denotes the transmittance. FIG. 18C shows one exemplary transmittance distribution set to the ND filter 154a. For example, the reason why the transmittance distribution having the transmittances of 90% and opening (100%) is set to the areas a and e of the ND filter 154a in FIG. 18C, although the same polarizations A and E are set as shown in FIG. 18A, is that the angular dependency of the transmittance shown in FIG. 18B is considered. The reason why this embodiment sets the constant transmittance to one filter is that the modified illumination, such as a dipole illumination, usually used for the polarization controlled illumination uses a limited area, such as a dipole, and the transmittance difference that depends upon the incident angle is small in the actually used area in the filter. Thus, it is optional to consider the angular dependency characteristic in one filter.

In an attempt to use the phase plate 155 to generate different polarizations in different areas on the pupil 310, the filter member 154 suitable for the polarization of each area is provided and corrects the mirrors' influence that indicate different transmittances for each area. While FIG. 17 does not show that the controller 500 is connected to the filter member 154 for illustration convenience, the controller 500 can control the filter member 154 via a switching means (not shown). The filter member 154 and the phase plate 155 are exchanged in a pair. Thus, step 1008 is not limited to the initial arrangement of the filter member 154.

The detector 190 uses, for example, two sensors, and can measure each polarization component, such as X-polarized light component and Y-polarized light component. Of course, a position of the detector 190 is not limited to this position. For example, the detector 190 may be provided on the wafer stage. Alternatively, the detector 190 may be located at a position of the light amount detector 170. However, the detection at this point does not reflect the reflection and transmission characteristics of the half-mirror 152 and the reflection characteristic of the mirror 151. Therefore, the effective light source distribution on the surface to be illuminated needs to be calculated by considering these characteristics and redesigning the optical system.

Figure 8C:
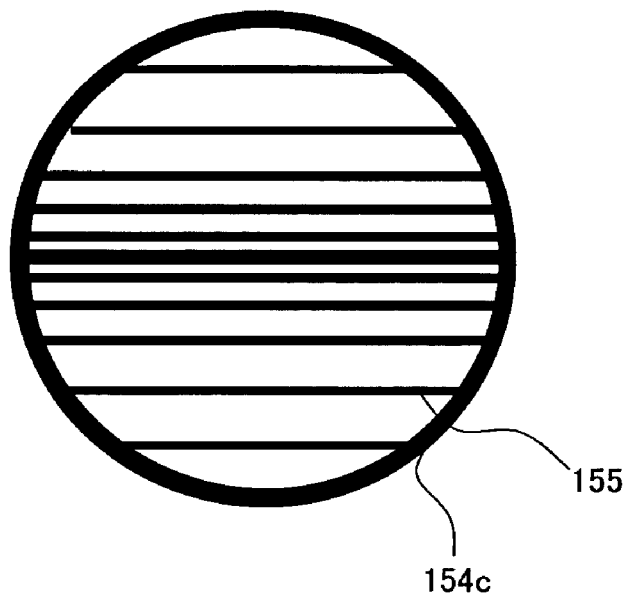

The filter member 154 is not limited to an optical filter that changes an optical concentration distribution and may use, for example, a mechanical light shielding part 155 that has different pitches and light shielding widths in the Y direction, like a filter member 154c shown in FIG. 8C. In FIG. 8C, black lines denote the light shielding parts 155, and white lines denote light transmitting parts. When a mechanical light shield is located just before the fly-eye lens 156, the structure appears on the incident surface of the fly-eye lens 156 and affects the light intensity distribution on the surface to be illuminated and a deviation of the σ distribution at illuminated positions. Therefore, the mechanical light shield is preferably separated from the incident surface of the fly-eye lens 156 by a predetermined amount to the extent that the fine structure does not appear on the incident surface of the fly-eye lens 156.

The mechanical filter member 154 is particularly effective to a catoptric optical system that uses no refractive element as in an exposure apparatus that utilizes the extreme ultraviolet ("EUV") as a light source. The structure of the EUV exposure apparatus is quite different from the above exposure apparatus, and basically uses a reflective optical system that includes only mirrors from the light source to the surface to be illuminated. Many mirrors may cause the asymmetry of the effective light source. One or plural mechanical filters like the filter member 154 near the pupil surface of the surface to be illuminated would be able to correct the non-uniformity.

While the above embodiment discusses the light shaping means 120 having a DOE, this embodiment intends to correct the non-uniformity of the σ distribution caused by the projection optical system's mirrors, the illumination optical system's mirrors 150 to 152, and other factors. Therefore, the DOE is not necessarily vital. As shown in FIG. 1, any optical system is apparently applicable to this embodiment as long as the optical system forms a controlled, light shape distribution on the surface A.

Alternatively, a separation from the ideal σ distribution is also effective. For example, when a reticle pattern itself has a CD directional difference, when the projection lens' aberration causes a directional difference of a pattern, and when an exposed CD difference occurs between a main scan direction and an orthogonal sub-scan direction in the exposure apparatus 1, a filter may be selected which corrects the directional difference of the actually exposed pattern.

A second solution for the problem of a non-uniform effective light source distribution due to the non-uniform transmittance distribution up to the pupil 310 is to change the effective light source and to make the integral intensity uniform on the surface to be illuminated. This embodiment provides the σ shape correction mechanism 128 for this purpose. The σ shape correction mechanism 128 may be used together with the filter member 154 or they may be used singularly.

For a quick and easy adjustment, the preferred embodiment uses the filter member 154 to correct the fixed σ distribution transmittance that does not depend upon the illumination condition, such as the illumination optical system's mirrors 150 to 152 and the projection optical system's mirrors, and uses the σ shape correction mechanism 128 for fine corrections for each illumination condition. The σ shape correction mechanism 128 can bring the σ distribution on the surface to be illuminated close to the ideal one. In particular, the non-uniformity of the σ distribution easily occurs due to the mirror, half-mirror and antireflection coating in the polarization controlled illumination. The σ shape correction mechanism 128 properly adjusts the non-uniformity in accordance with a change of the polarization.

A separation from the ideal σ distribution is also effective. For example, when a reticle pattern has a CD directional difference, when the projection lens' aberration causes a directional difference of a pattern, and when an exposed CD difference occurs between the main scan direction and an orthogonal sub-scan direction in the exposure apparatus 1, the symmetry of the σ distribution is changed so as to correct the CD directional difference of the finally exposed pattern.

Referring now to FIG. 10, a description will be given of the operation of the σ shape correction mechanism 128. Here, FIG. 10 is a view showing an operation of the σ shape correction mechanism 128 when the light shaping means 120 forms a uniform light intensity distribution on the surface A, and the light intensity distribution on the surface A (as a sectional view parallel to the paper surface). Each reference numeral in FIG. 10 corresponds to that in FIG. 1. The light emitted from the light shaping means 120 forms a distribution having a predetermined shape on the surface A. The light shaping means 120 that includes two or more optical integrators, such as a fly-eye lens, an internal surface reflecting integrator, a DOE, etc. and a combination of these components, can provide a controlled distribution having a desired shape on the surface A as well as a controlled distribution of the angular characteristic of the incident light. Of course, even when the light from the light source fluctuates, the distribution and angular characteristics maintain constant. The σ shape correction mechanism 128 includes light shielding members 129a and 129b.

Figure 10A:
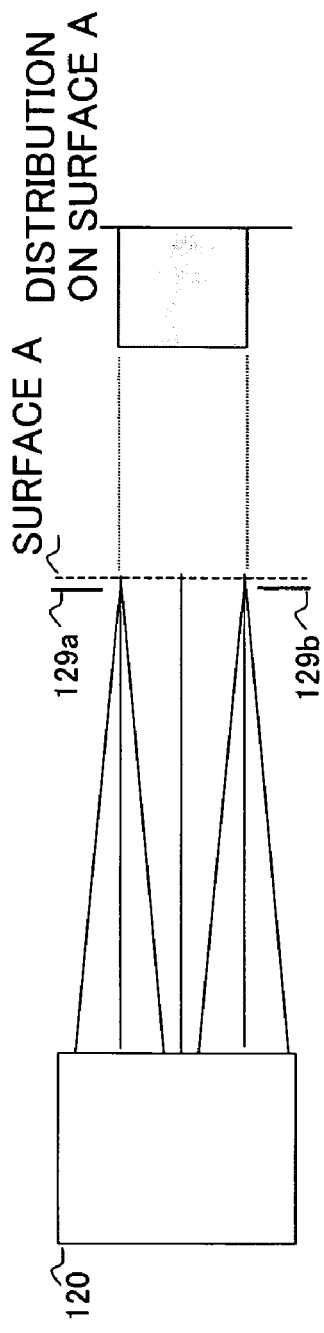
FIGS. 10A to 10C are schematic view for explaining operations of different types of σ shape correction mechanisms in the exposure apparatus shown in FIG. 1.

In FIG. 10A, the light shielding members 129a and 129b of the σ shape correction mechanism 128 are located near the surface A, and set to such states that they do not restrict the light from the light shaping means 120. Therefore, the light intensity distribution on the surface A is maintained uniform.

Figure 10B:
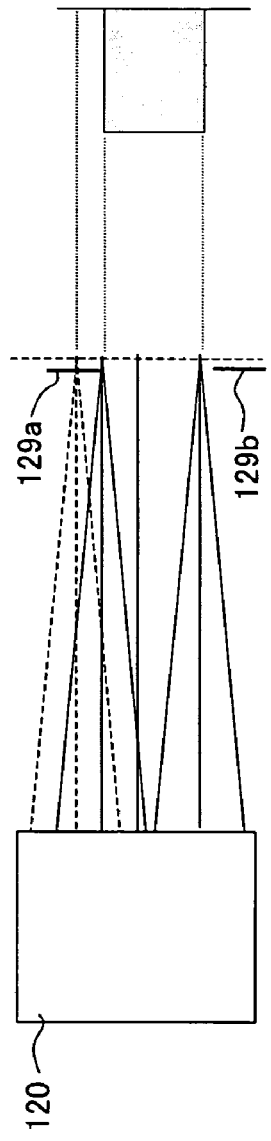

FIG. 10B shows that the light shielding member 129a is inserted into the optical path in the state in FIG. 10A. Since the light shielding member 129a shields the light, the distribution is partially lost on the surface A. While the distribution on the surface A is then converted into another shape due to the light adjusting means 130, if necessary, the incident surface of the fly-eye lens 156 or the σ distribution is partially lost in accordance with the distribution shape on the surface A. Thus, the σ distribution can be partially modified by varying the state of the σ shape correction mechanism 128. For example, the magnitude of the σ distribution can be adjusted in two orthogonal directions by inserting the light shielding member 129b into the optical path similar to the light shielding member 129a. The controller 500 moves the light shielding member 129a, for example, based on an output of the detector 190. The controller 500 determines whether the distribution of the effective light source shifts from a predetermined distribution, and adjusts the effective light source via the σ shape correction mechanism 128 based on the determination result. For example, when the transmittance is non-uniform, the controller 500 controls the movement of the light shielding member 129a so as to provide a uniform integral intensity of the effective light source distribution on the reticle 200 surface in plural directions from the optical axis.

Figure 10C:
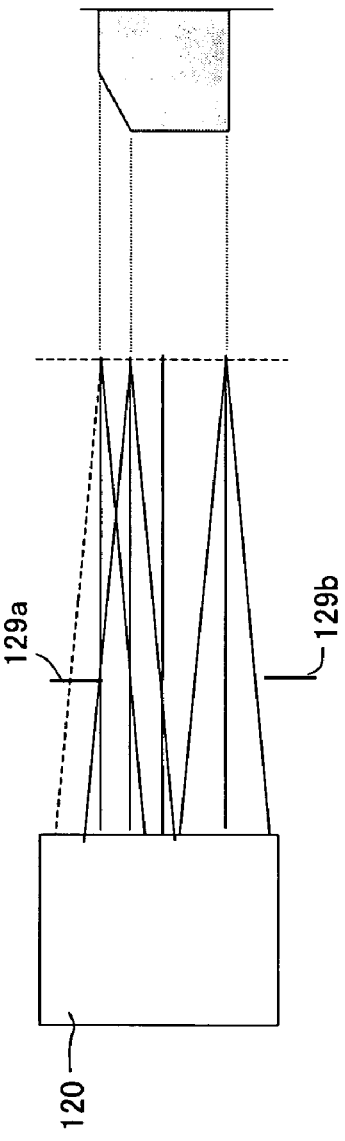

FIG. 10C arranges the light shielding members 129a and 129b of the σ shape correction mechanism 128 apart from the surface A. In this case, the distribution on the surface A is not partially lost unlike FIG. 10B, but maintains its outline and partially reduces its intensity. This configuration is preferable if it is necessary to maintain the outline and partially reduce the intensity in the final σ distribution. The controller 500 controls a movement of the light shielding member 129a, similar to FIG. 10B, based on an output from the detector 190. Thus, a simple structure can partially change the intensity by adjusting the light shielding member in the σ shape correction mechanism 128. The position of the σ shape correction mechanism 128 from the surface A may be adjusted if necessary or fixed in place. The position of the σ shape correction mechanism 128 is not limited to a position near the surface A but may be a position near the incident surface of the fly-eye lens 156, for example.

Figure 11A:
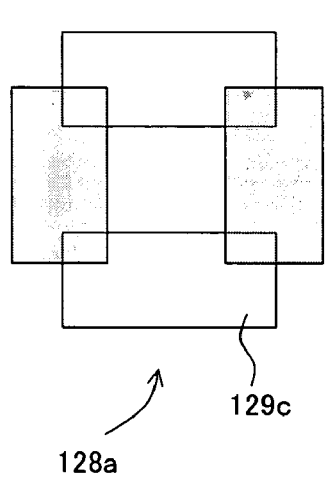
FIGS. 11A to 11C are schematic plane views of the σ shape correction mechanisms shown in FIGS. 10A to 10C.
Figure 11B:
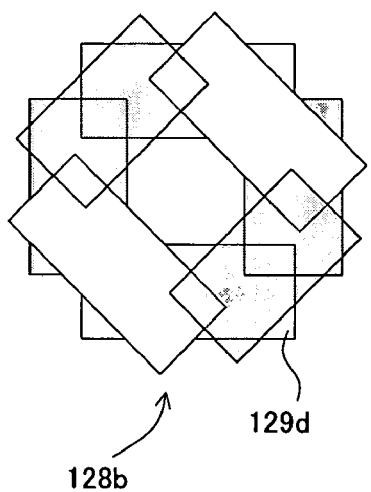
Figure 11C:
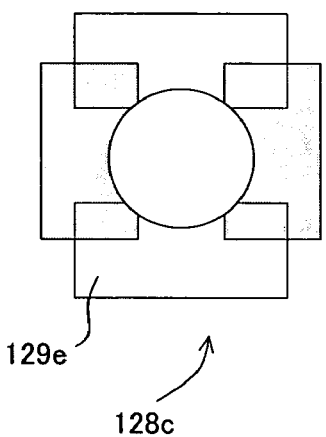

FIGS. 11A to 11C are schematic plane views showing illustrative structures of different types of σ shape correction mechanisms 128. FIG. 11A shows a σ shape correction mechanism 128a that includes four, separately drivable, light shielding members 129. For example, the controller 500 obtains an output from the measuring part 190 shown in FIG. 1, and moves a position of each light shielding member 129c based on the output information so as to minimize the XY difference in the effective light source shape. Alternatively, it may be possible to move a position of each light shielding member 129c from the exposure result so as to minimize a directional difference of an exposed pattern.

If the telecentricity, i.e., the perpendicularity of the light, on the reticle 200 surface changes as the σ shape correction mechanism 128 is driven, one or more of lenses in the light shaping means 120 (or lens of the optical system 126) and one or more lenses in the zooming imaging optical system 140 are decentered from the optical axis and adjusted. Of course, the σ shape correction mechanism 128 may be driven to adjust the telecentricity. The σ shape correction mechanism 128 can reduce the decentering and non-uniformity of the σ distribution.

FIG. 11B shows a σ shape correction mechanism 128b that includes eight, separately drivable, light shielding members 129d. The σ shape correction mechanism 128b provides multidirectional corrections. FIG. 11C shows a σ shape correction mechanism 128c that includes four light shielding members 129e having curved light shielding edges suitable for the circular and annular shapes because the σ distribution usually uses these shapes for the base shape.

Figure 16A:
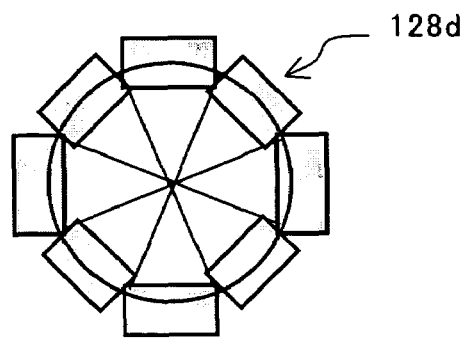
FIGS. 16A and 16B are views of a phase plate structure, and an effective light source correction using a filter member and a stop in a polarized illumination that generates different polarizations on a pupil.
Figure 16B:
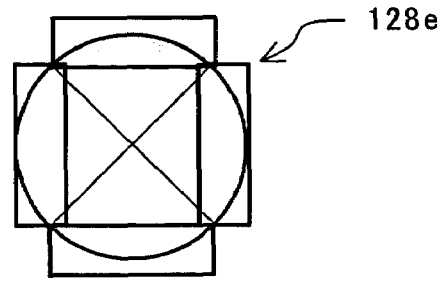

Even in the polarized illumination, the σ shape correction mechanism 128 may be used instead of or together with the filter member 154. In this case, the σ shape correction mechanism 128b and a σ shape correction mechanism 128d shown in FIG. 16A are applicable to the filter member 154a and the phase plate 155a shown in FIG. 18A. A σ shape correction mechanism 128e shown in FIG. 16B is applicable to the filter member 154b and the phase plate 155b shown in FIG. 18B. The functions of the σ shape correction mechanisms 128d and 128e are similar to those of the σ shape correction mechanisms 128a to 128c.

As the σ shape correction mechanisms 128a to 128e adjust the effective light source, the effective coherence factor σ reduces in a direction along which the light shielding member moves to the center. In other words, the effective coherence factor σ decreases and reduces the directional difference. In this case, if the average magnitude of σ reduces, the magnification of the zooming imaging optical system 140 is made larger so as to adjust the average magnitude of σ.

The σ shape correction function may be used to aggressively modify the effective light source, in addition to the fine correction of its shape. For example, this function provides a dipole illumination state from the annular illumination and the quadrupole illumination.

The reticle 200 is made, for example, of quartz, has a circuit pattern (or an image) to be transferred, and is supported and driven by a reticle stage (not shown). The diffracted light through the reticle 200 is projected through the projection optical system 300 onto the plate 400. The reticle 200 and the plate 400 have an optically conjugate relationship. Since the exposure apparatus 1 of this embodiment is a step-and-scan type exposure apparatus (also referred to as a "scanner"), it scans the reticle 200 and the plate 400 at a speed ratio corresponding to a reduction ratio, and transfers the pattern of the reticle 200 onto the plate 400. When the exposure apparatus 1 is a step-and-repeat type exposure apparatus (also referred to as "a stepper"), the reticle 200 and the plate 400 are kept stationary during exposure.

The projection optical system 300 is an optical system that projects a pattern of the reticle 200 onto the plate 400. The projection optical system 300 has an aperture stop on the pupil 310 that arbitrarily sets an NA. The aperture stop makes variable the aperture diameter that defines the NA of the imaging light on the plate 400 and varies the aperture diameter to obtain the necessary NA. In this embodiment, the coherence factor σ is a ratio between the size of the images of the plural light sources formed by the fly-eye lens 156 at the position of the aperture stop and the aperture diameter of the aperture stop.

The surface B that forms multiple light sources and the diameter variable aperture stop in the projection optical system are arranged at approximately optically conjugate positions, and the distribution on the surface B is substantially the σ distribution or effective light source on the plate 400 surface. When the stop 158 is installed on the surface B, the distribution that is not shielded by the stop 158 forms the σ distribution. When no stop 158 is provided on the surface B and the fly-eye lens 156 has sufficiently fine rod lenses (e.g., several tens of rows in one direction), the distribution on the incident surface of the fly-eye lens 156, which is formed by a combination of the light shaping means 120, light adjusting means 130 and the imaging optical system 140, determines the effective σ distribution.

A position of the stop 158 is not limited to a position near the surface B. For example, the stop 158 may be inserted b into an optical path on the surface A by the switching means, such as a turret, together with the light adjusting means 130 or may be arranged just before the fly-eye lens 156 or arranged at these plural positions simultaneously. For example, a desired σ distribution can be formed by arranging at a position of the beam changing means 130 a stop having a mechanism that does not restrict a radial direction that is a direction for restricting the size and can vary only an aperture angle, such as a quadrupole, by arranging an iris stop that restricts the size just before the fly-eye lens 156, and by arranging a fixed stop on the surface B. A versatile σ condition can be produced by arranging stops having different functions at plural positions and by changing and switching these stops.

While the projection optical system 300 of this embodiment is an optical system that includes plural lens elements 320 and 322, it may use a catadioptric optical system comprised of a plurality of lens elements and at least one mirror, an optical system comprised of a plurality of lens elements and at least one DOE such as a kinoform, and a catoptric optical system, and so on. Any necessary correction of the chromatic aberration may use a plurality of lens units made from glass materials having different dispersion values (Abbe values), or arrange a DOE such that it disperses in a direction opposite to that of the lens unit. In such a catadioptric optical system, even when the non-uniformity of the transmittance distribution in the illumination optical system 110 is corrected, the non-uniformity of the transmittance distribution occurs on the projection lens's pupil 310 due to the mirror in the projection optical system. It is therefore necessary to arrange the filter and stop that cancel the non-uniformity of the transmittance distribution generated by mirrors in both the illumination and projection optical systems. An alternative embodiment fills the space between the final surface of the projection optical system 300 and the plate 400 with a liquid, such as pure water. An effect of the polarization control is particularly remarkable in such an immersion type projection exposure apparatus due to the high NA scheme.

The plate 400 is a wafer in this embodiment, but it may include a liquid crystal plate and a wide range of other objects to be exposed. Photoresist is applied onto the plate 400.

The plate stage 450 supports the plate 400. The plate stage 450 may use any structure known in the art, and a detailed description of its structure and operations will be omitted. For example, the plate stage 450 uses a linear motor to move the plate 400 in a direction orthogonal to the optical axis. The reticle 200 and plate 400 are, for example, scanned synchronously, and positions of the reticle stage (not shown) and plate stage 450 are monitored, for example, by a laser interferometer and the like so that both are driven at a constant speed ratio. The plate stage 450 is installed on a stage stool supported on the floor and the like, for example, via a damper. The reticle stage (not shown) and the projection optical system 300 are a barrel stool (not shown) that is supported on a base frame placed on the floor, for example, via a damper.

In exposure, the light emitted from the light source section 102 Koehler-illuminates the reticle 200 via the illumination optical system 110. The light that passes the reticle 200 and reflects the reticle pattern forms an image on the plate 400 via the projection optical system 300. The exposure apparatus 1 forms a desired effective light source using the filter member 154 and/or the σ shape correction mechanism 128, and provides high-quality devices (such as semiconductor devices, LCD devices, image pick-up devices (such as CCDs), thin film magnetic heads, and the like).

While the above embodiments simply describe use of both the filter member 154 and the σ shape correction mechanism 128, the following description discusses a more concrete embodiment.

A description will now be given of a selection of the filter member 154. As discussed above, it is preferable to install the filter member 154 that corrects the fixed asymmetry that does not depend upon the effective light source distribution or the asymmetry caused by the mirrors. The transmittance distribution of the installed filter 154 is determined by one of the following methods:

A first method uses design values of the mirrors between the surface A and the surface to be illuminated and a measurement result of the reflection or transmission characteristics of the manufactured mirrors, calculates the transmittance distribution in the σ distribution, and selects the filter member having σ distribution that cancels out the non-uniform distribution.

A second method irradiates a distribution that has an effective σ area that is made as uniform as possible on the surface A, onto the incident surface of the fly-eye lens, and measures the actual effective light source distribution on the surface to be illuminated. Then, this method compares an effective light source distribution incident upon the surface A, which is predicted on the surface to be illuminated without any mirror, or a designed effective light source distribution, with an actual effective light source distribution. Finally, this method selects a filter having such a distribution that the actual effective light source distribution is approximately the same as the designed effective light source distribution.

A third method actually exposes a pattern in two directions, such as the XY directions, using a typical illumination mode, such as an annular illumination in which the outer side has a larger σ, and selects a filter member that equalizes the size of a pattern in the X direction to the size of a pattern in the Y directions.

Figure 14A:
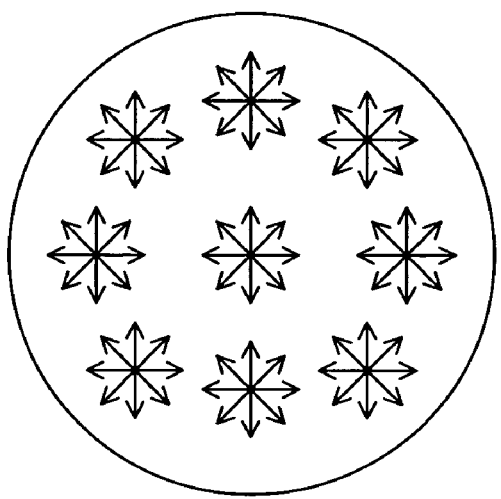
FIGS. 14A to 14E are views showing illustrative polarizations in the light in the effective light source distribution.
Figure 14B:
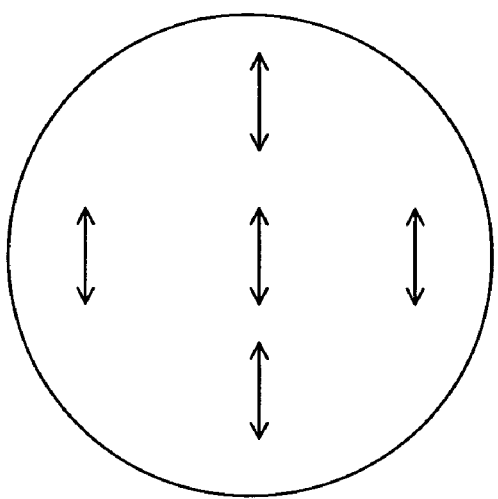
Figure 14C:
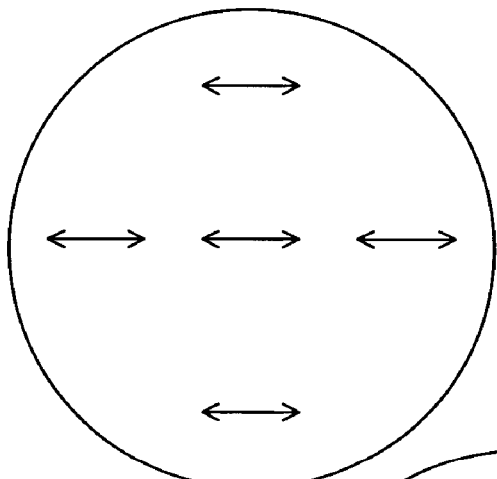
Figure 14D:
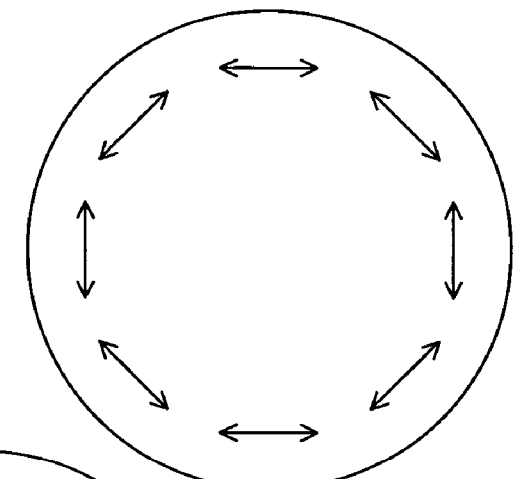
Figure 14E:
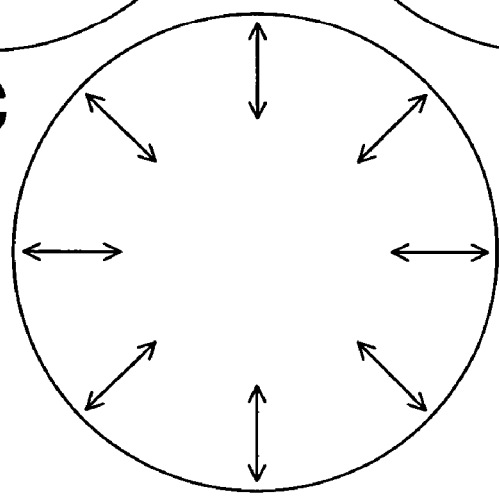

The determination methods thus select the filter member 154. For example, the illumination optical system that controls the polarization may select the filter member for each polarization. In the illumination optical system that controls the polarization, the polarization is classified into five groups as shown in FIGS. 14A to 14E. Here, FIGS. 14A to 14E show the polarizations of the lights in the σ distribution. More specifically, FIG. 14A shows a normal illumination that uses the non-polarized light or the circular illumination. FIG. 14B shows an illumination that utilizes a linearly polarized light in the Y direction. FIG. 14C shows an illumination that utilizes a linearly polarized light in the X direction. FIG. 14D shows a tangentially polarized illumination. FIG. 14E shows a radially polarized illumination.

One filter is prepared for each polarization, and these filters are arranged on a turret and switched according to the polarization to be set. Of course, irrespective of the polarization, only one filter that is optimized, for example, to the non-polarization may be installed.

It is conceivable to use plural phase plates and to generate different polarizations in different areas on a pupil as shown in FIGS. 16A and 16B. In this case, the transmittance can be different for each area due to the influences of the mirrors, but it is preferable to provide each area with a filter suitable for the polarization of each area and to correct the transmittance distribution on the entire pupil. Since the transmittance distribution varies as the polarization varies, it is preferable to replace or combine a filter with one suitable for each polarization as the phase plate switches. For example, suppose that several types of polarizations for use with the exposure are known, and several types of phase plates that form polarizations are prepared on a turret. By previously obtaining a filter suitable for the polarization generated with each phase plate, and by installing the filter on the turret that moves in synchronization with the phase plate turret, the filter suitable for the polarization is preferably varied as the phase plate turret is moved and the polarization is varied.

A description will now be given of the setting of the σ shape correction mechanism 128. The σ shape correction mechanism 128 is set at a position in accordance with a change of the illumination condition. One of the following setting methods is applicable:

A first method measures the effective light source distribution using the detector 190, etc. while the σ shape correction mechanism 128 does not restrict the light. The measured effective light source distribution is divided into plural areas, e.g., four areas, and the light intensity ratio among these areas is measured. The light shielding members in the σ shape correction mechanism 128 are driven so that the light intensity ratio becomes a desired value.

A second method exposes plural patterns that extend plural directions, e.g., two directions, while the σ shape correction mechanism 128 does not restrict the light. The light shielding members in the σ shape correction mechanism 128 are driven so that the CD difference among these patterns becomes a desired difference.

While the simultaneous use of these two means is discussed above, even use of only a single means is significantly effective.

In the illumination optical system that controls the polarization, the light shielding members may be driven for each polarization. In the illumination optical system that controls the polarization, the polarizations are as shown in FIGS. 14A to 14E, and the light shielding members may be driven for each polarization. Of course, the light shielding members may be driven always to a position optimized, e.g., a non-polarization, irrespective of the polarization.

In addition, it is conceivable to generate a different polarization for a different area on the pupil using plural phase plates, as shown in FIG. 16. In this case, the transmittance differs among areas due to the influence of the mirrors, etc., but the intensity distribution may be corrected without correcting the outline of the effective light source or changing the outline, by driving the light shielding member to a position suitable for the polarization for each area. Since the transmittance distribution varies whenever the polarization varies, a stop is preferably turned to one suitable for each polarization as the polarization or the phase plate varies.

For example, suppose that several types of polarizations for exposure are known, and several types of phase plates for forming the polarizations are prepared in advance using a turret, etc. Preferably, an optimal stop shape and structure (including a width and position of each light shielding plate and the number of light shielding plates) are studied to the polarization generated with each phase plate, and arranged on the turret that moves in synchronization with the phase plate's turret so that the stop optimal to the polarization switches as the phase plate's turret moves and the polarization varies. In addition, whenever the polarization varies minutely, the light shield member is preferably driven.

Figure 12:
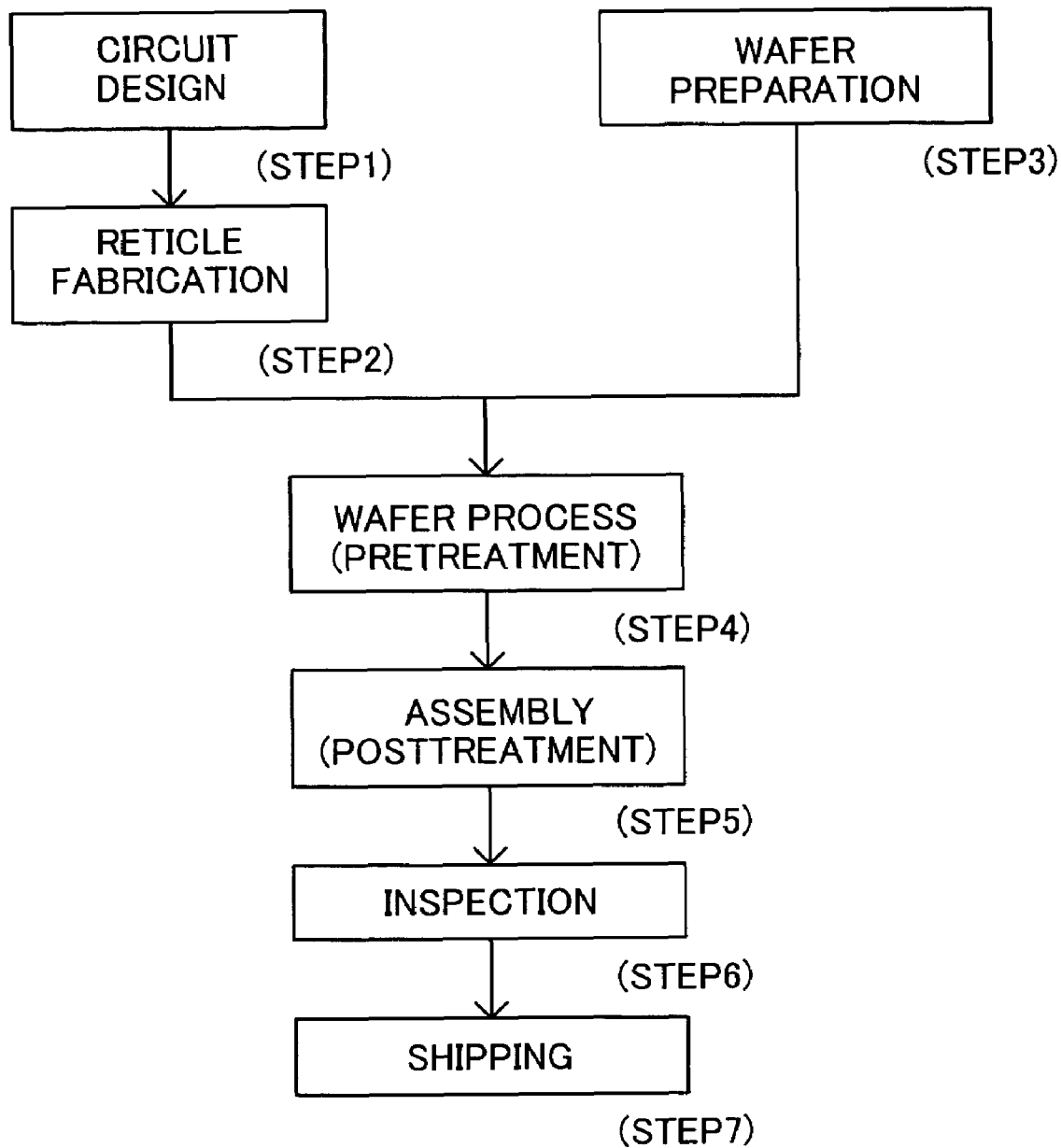
FIG. 12 is a flowchart for explaining a fabrication of devices (semiconductor chips such as ICs, LSIs, and the like, LCDs, CCDs, etc.).
Figure 13:
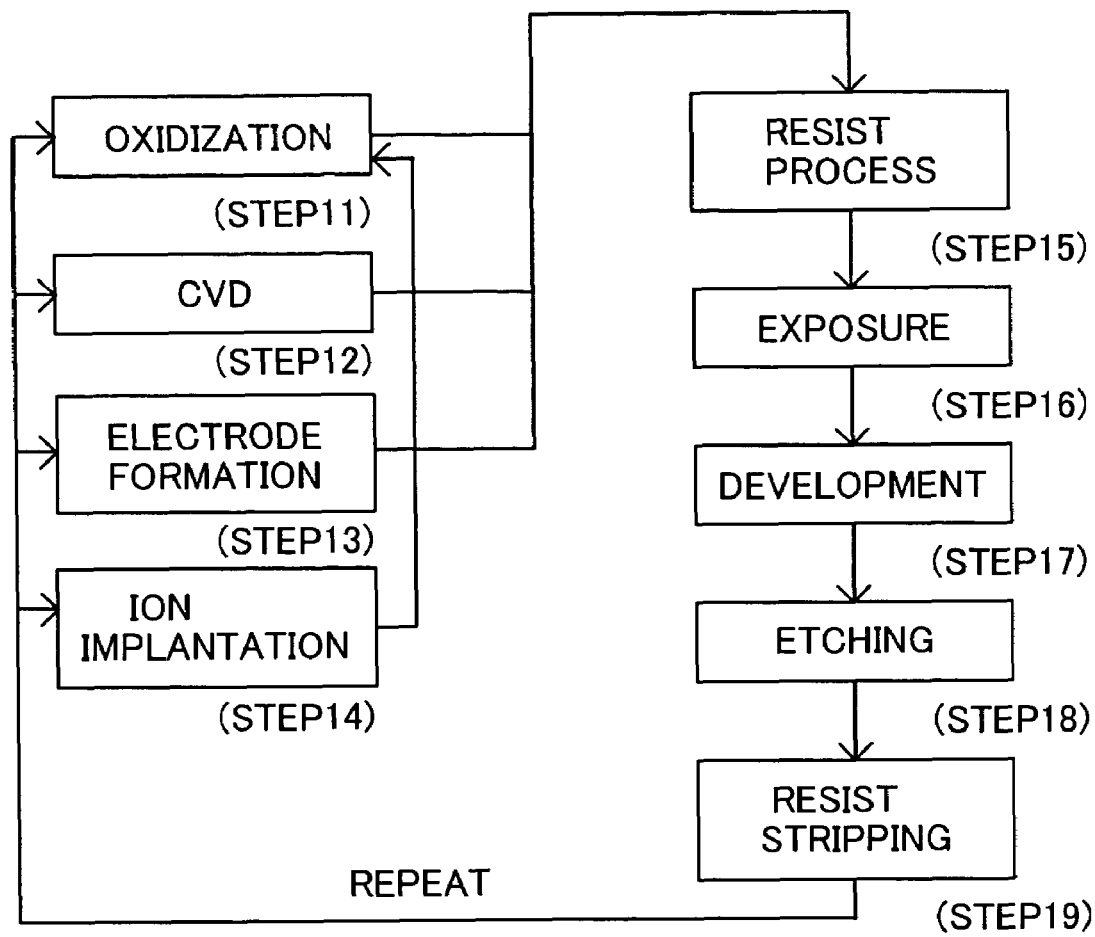
FIG. 13 is a detailed flowchart of a wafer process in step 4 shown in FIG. 12.

Referring now to FIGS. 12 and 13, a description will now be given of an embodiment of a device manufacturing method using the above exposure apparatus 1. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a reticle pattern onto the wafer. Step 17 (development) develops the exposed wafer 47. Step 18 (etching) etches parts other than a developed resist image. Step 19 (resist stripping) removes disused resist after etching. These steps are repeated, and multilayer circuit patterns are formed on the wafer. This device manufacturing method can manufacture higher-quality devices than the conventional method. Thus, the device manufacturing method that uses the exposure apparatus 1, and its resultant (intermediate and final) products also constitute one aspect of the present invention.

Further, the present invention is not limited to these preferred embodiments, and various variations and modifications may be made without departing from the scope of the present invention.

The exposure apparatus 1 of this embodiment arranges mirrors in such a way that the optical path is arranged on one plane from the surface A that forms a base shape of the effective light source to the reticle 200 surface. In addition, the exposure apparatus 1 arranges the filter member 154 that corrects the mirror characteristic, near the effective light source forming surface, so as to facilitate a formation of the optical configuration, to make the σ distribution symmetrical with respect to the optical axis, and to reduce the HV difference of an exposed pattern, which is caused by the effective light source. Moreover, the exposure apparatus 1 arranges the σ shape correction mechanism 128 that has plural, separately drivable, light shielding members near the surface A, so as to make the σ shape variable, and reduce the HV difference of the exposed pattern which does not attribute to the illumination optical system. Furthermore, the exposure apparatus 1 arranges, at plural positions, light shielding members for defining an illumination condition (such as a fixed stop, a variable stop, an iris stop, and a σ shape correction mechanism), divides the functionality, and provides more diversified illumination conditions.

This application claims a benefit of foreign priority based on Japanese Patent Applications Nos. 2004-166552, filed on Jun. 4, 2004 and 2005-116585, filed on Apr. 14, 2005, each of which is hereby incorporated by reference herein in its entirety as if fully set forth herein.

What is claimed is:

1. An illumination optical system that is used for an exposure apparatus that includes a mirror and exposes an object, said illumination optical system illuminating a surface to be illuminated using light from a light source, and comprising:
    a polarization setting section for setting a predetermined polarization of the light to each of plural areas in an effective light source as an incident angle distribution of the light on the surface to be illuminated; and
    plural filter members arranged at a position that substantially has a Fourier transform relationship with the surface to be illuminated,
    wherein each filter is arranged to a corresponding one of the plural areas in the effective light source, and has a transmittance distribution that is optimized to each polarization.

2. An illumination optical system according to claim 1, further comprising an optical integrator for uniformly illuminating the surface to be illuminated,
    wherein said filter member is arranged near an incident or exit surface of said optical integrator or near a surface optically conjugate with the incident or exit surface of said optical integrator.

3. An illumination optical system according to claim 1, wherein the transmittance distribution of the filter member changes in a first direction and substantially maintains in a second direction orthogonal to the first direction.

4. An illumination optical system according to claim 1, wherein the filter member has a light shield member.

5. An illumination optical system according to claim 1, wherein said illumination optical system includes plural types of polarization setting sections and plural types of filter members each type of which corresponds to one of the plural types of polarization setting sections, each pair of the polarization setting section and the filter member being arranged on an optical path switchably.

6. An illumination optical system according to claim 1, wherein said polarization setting section includes a λ/2 phase plate.

7. An exposure apparatus comprising:
    an illumination optical system according to claim 1 for illuminating a reticle as a surface to be illuminated using light from a light source; and
    a projection optical system for projecting a pattern of a reticle onto an object.

8. A device manufacturing method comprising the steps of:
    exposing an object using an exposure apparatus according to claim 7; and developing the exposed object.

9. An illumination optical system that is used for an exposure apparatus that includes a mirror and exposes an object, said illumination optical system illuminating a surface to be illuminated using light from a light source, and comprising:
    a light shaping member for forming a shape of an effective light source as an incident angle distribution of the light on the surface to be illuminated, and
    a stop that is arranged movably along an optical axis of the illumination optical system,
    wherein the stop is arranged near a position that substantially has a Fourier transform relationship with the surface to be illuminated.

10. An illumination optical system according to claim 9, wherein the stop includes plural, separately drivable, light shielding members.

11. An illumination optical system according to claim 10, wherein the light shielding member changes a shape of the effective light source.

12. An illumination optical system according to claim 10, wherein the light shielding member changes an intensity of the effective light source without changing a shape of the effective light source.

13. An illumination optical system according to claim 11, further comprising:
    a polarization setting section for setting a predetermined polarization state of the light to each of plural areas in the effective light source.

14. An illumination optical system according to claim 12, further comprising:
    a polarization setting section for setting a predetermined polarization state of the light to each of plural areas in the effective light source.

15. An illumination optical system according to claim 13, wherein the plural light shielding members are moved, depending on the predetermined polarization state.

16. An illumination optical system according to claim 14, wherein the plural light shielding members are moved, depending on the predetermined polarization state.

17. An illumination optical system according to claim 10, wherein the plural light shielding members are moved, depending on the effective light source.

18. An exposure apparatus comprising:
    an illumination optical system according to claim 9 for illuminating a reticle as a surface to be illuminated using light from a light source; and
    a projection optical system for projecting a pattern of a reticle onto an object.

19. An exposure apparatus according to claim 18, wherein the mirror is a broadband high-reflection coating mirror.

20. A device manufacturing method comprising the steps of:
    exposing an object using an exposure apparatus according to claim 18; and developing the exposed object.

21. An illumination optical system that is used for an exposure apparatus that includes a mirror and exposes an object, said illumination optical system illuminating a surface to be illuminated using light from a light source, and comprising
    a filter member arranged at a position that substantially has a Fourier transform relationship with the surface to be illuminated,
    wherein a transmittance of the filter varies to a first direction and is constant in a direction that is perpendicular to the first direction.

22. An illumination optical system according to claim 21, further comprising:

the plural filters, and a light shaping member for forming a shape of an effective light source as an incident angle distribution of the light on the surface to be illuminated, wherein the plural filters are replaced, depending on the effective light source.

23. An illumination optical system according to claim 21, further comprising:

a light shaping member for forming a shape of an effective light source as an incident angle distribution of the light on the surface to be illuminated, and a polarization setting section for setting a predetermined polarization state of the light to each of plural areas in the effective light source, wherein the plural filters are replaced, depending on the effective light source and/or the predetermined polarization state.

24. An exposure apparatus comprising:

an illumination optical system according to claim 21 for illuminating a reticle as a surface to be illuminated using light from a light source; and a projection optical system for projecting a pattern of a reticle onto an object.

25. An exposure apparatus according to claim 24, wherein the mirror is a broadband high-reflection coating mirror.

26. A device manufacturing method comprising the steps of:

exposing an object using an exposure apparatus according to claim 24; and developing the exposed object.

27. An illumination optical system that is used for an exposure apparatus that includes a mirror and exposes an object, said illumination optical system illuminating a surface to be illuminated using light from a light source, and comprising:

plural types of polarization setting sections for setting a predetermined polarization state of the light to each of plural areas in an effective light source as an incident angle distribution of the light on the surface to be illuminated, the plural types of polarization setting sections that are switchably arranged on an optical path;

a stop that is arranged movably along an optical axis of the illumination optical system;

a controller for controlling a shape, a diameter and/or a position of the stop in accordance with switching of the polarization setting sections.

28. An exposure apparatus comprising:

an illumination optical system for illuminating a reticle as a surface to be illuminated using light from a light source; and a projection optical system for projecting a pattern of a reticle onto an object;

wherein a broadband high-reflection coating mirror is arranged in the illumination optical system and/or the projection optical system, wherein said illumination optical system comprises a filter member arranged at a position that substantially has a Fourier transform relationship with the surface to be illuminated, said filter member including a transmittance distribution preset to correct a non-uniformity of a transmittance distribution of said illumination optical system caused by said mirror.

* * * * *